United States Patent
Saitoh et al.

(10) Patent No.: US 8,686,525 B2
(45) Date of Patent: Apr. 1, 2014

(54) MAGNETIC SENSOR AND MAGNETIC MEMORY

(75) Inventors: Eiji Saitoh, Miyagi (JP); Hiroyasu Nakayama, Miyagi (JP); Kazuya Harii, Miyagi (JP)

(73) Assignee: Toroku University, Sendai-shi (JP)

( * ) Notice: Subject to any disclaimer, the term of this patent is extended or adjusted under 35 U.S.C. 154(b) by 0 days.

(21) Appl. No.: 13/258,723

(22) PCT Filed: Mar. 24, 2010

(86) PCT No.: PCT/JP2010/055049
§ 371 (c)(1),
(2), (4) Date: Sep. 22, 2011

(87) PCT Pub. No.: WO2010/110297
PCT Pub. Date: Sep. 30, 2010

(65) Prior Publication Data
US 2012/0012956 A1    Jan. 19, 2012

(30) Foreign Application Priority Data

Mar. 25, 2009  (JP) .................................. 2009-073088

(51) Int. Cl.
*H01L 27/22*  (2006.01)

(52) U.S. Cl.
USPC ................. 257/427; 257/421; 257/E43.005; 257/E27.005

(58) Field of Classification Search
USPC .......... 257/421, 427, 414, E43.001, E43.005, 257/E27.005
See application file for complete search history.

(56) References Cited

U.S. PATENT DOCUMENTS

| | | | |
|---|---|---|---|
| 2004/0023075 A1* | 2/2004 | Saito et al. | 428/694 MM |
| 2004/0057295 A1* | 3/2004 | Matsukawa et al. | 365/200 |
| 2004/0154405 A1* | 8/2004 | Ganapathi et al. | 73/763 |
| 2006/0251928 A1* | 11/2006 | Quandt et al. | 428/811.2 |
| 2008/0002481 A1* | 1/2008 | Gogl et al. | 365/189.06 |
| 2008/0225581 A1* | 9/2008 | Yamane et al. | 365/171 |
| 2009/0146131 A1* | 6/2009 | Happ | 257/5 |

OTHER PUBLICATIONS

S.Takahashi et al., "Spin current through a normal-metal / insulating-ferromagnet Junction", Journal of Physics: Conference Series, Feb. 15, 2010, vol. 200, pp. 062030-1 thru 062030-4.

Y. Kajiwara et al., "Spin pumping and spin-Hall effect observed in metallic films", Journal of Physics: Conference Series, Mar. 31, 2009, vol. 150, pp. 042080-1 thru 042080-4.

* cited by examiner

*Primary Examiner* — Marc Armand
(74) *Attorney, Agent, or Firm* — Westerman, Hattori, Daniels & Adrian, LLP (57) ABSTRACT

The invention relates to a magnetic sensor and a magnetic memory which sense magnetic information held by a ferromagnetic body without a current flowing through the ferromagnetic body. The magnetic sensor and magnetic memory use a magnetoresistive effect generated in a current that flows through a metal layer along an interface, on at least the interface side, with a ferromagnetic dielectric layer and said metal layer being joined through said interface.

8 Claims, 11 Drawing Sheets

MAGNETIC SENSOR AND MAGNETIC MEMORY

TECHNICAL FIELD

The present invention relates to a magnetic sensor and a magnetic memory, and in particular to the structure where a ferromagnetic dielectric body having a small spin relaxation constant is used as a ferromagnetic body so that magnetic information can be sensed without allowing a current to flow through the ferromagnetic body.

BACKGROUND ART

In magnetic heads and magnetic sensors, a magnetoresistive effect where the electrical resistance of a substance changes when a magnetic field is externally applied and the anomalous Hall effect where a voltage is applied in the direction perpendicular to the current are used. At present, magnetoresistive effects include a metal-based anisotropic magnetoresistive effect (AMR), a giant magnetoresistive effect (GMR) and a tunnel magnetoresistive effect (TMR).

In a GMR element, for example, the direction of the spin of the electrons that carry out a sense current flowing through the GMR element, that is to say, whether it is an up spin or a down spin, changes the difference in the direction in which a free layer is magnetized and in which a pinned layer is magnetized, and this difference in the status is used to store information.

In recent years, attention has been given to a so-called MRAM that forms a magnetic memory cell where the same element structure as those in the above-described magnetic heads and magnetic sensors is used to hold information due to the difference in the direction of magnetization of the magnetic body.

In these magnetic memory cells, information is read out using a magnetoresistive effect and information is written in by applying a magnetic field or by inverting the direction of magnetization through spin injection (see Patent Document 1 or Patent Document 2).

In the above-described magnetic heads, magnetic sensors and magnetic memories, a metal magnetic body is used as the magnetic body for holding magnetic information, and therefore information is read out or information is written into a magnetic memory cell by allowing a current to directly flow through the magnetic body.

PRIOR ART DOCUMENTS

Patent Documents

Patent Document 1: Japanese Unexamined Patent Publication 2002-305337
Patent Document 2: Japanese Unexamined Patent Publication 2007-059879

SUMMARY OF THE INVENTION

Problem to Be Solved by the Invention

In the case where a current directly flows through a metal magnetic body, such problems arise that the current may generate heat, cause a chemical change, or cause electrons to migrate, which become major factors that lead to the deterioration of the elements.

In the case of a TMR element having a large magnetoresistive effect, a current flows through a tunnel joint having high resistance, and therefore such a problem arises that the element creates a large amount of noise.

Furthermore, metal magnetic bodies have a large spin relaxation constant $\alpha$, which makes writing in difficult in the spin RAM, and thus such a problem arises that a threshold current for writing in is large.

Accordingly, an object of the present invention is to sense magnetic information without allowing a current to flow through the ferromagnetic body.

Means for Solving Problem

In order to achieve the above-described object, the present invention provides a magnetic sensor using a magnetoresistive effect generated in a current that flows through a metal layer along an interface, on at least the interface side, with a ferromagnetic dielectric layer and the above-described metal layer being joined through the above-described interface.

In the case where a ferromagnetic dielectric layer and a metal layer that allows for a spin-orbit interaction with the ferromagnetic dielectric layer are formed so as to have an interface through which the layers are joined, the spin-orbit interaction generated in the current that flows through the metal layer along the interface, on at least the interface side, with the ferromagnetic dielectric layer and above-described metal layer being joined through the above-described interface and magnetic scattering from the interface provide such synergetic effects that a magnetoresistive effect can be generated in the metal layer portion without a current flowing through the ferromagnetic dielectric layer.

In addition, no current flows through the ferromagnetic dielectric layer, and as a result no heat is generated, no chemical change occurs, or no electrons migrate, and therefore deterioration of the element can be reduced greatly.

In this case, it is desirable for the ferromagnetic dielectric layer to be made of YIG (yttrium iron garnet) or yttrium gallium iron garnet, which are easily available and have a small spin relaxation constant, that is to say, a substance that can be represented by a general formula: $Y_3Fe_{5-x}Ga_xO_{12}$ ($0 \leq x < 5$). In addition, $Y_3Fe_{5-x}Ga_xO_{12}$ ($0 \leq x < 5$) has a ferrimagnetic structure, and therefore a thermally stable magnetoresistive effect element can be implemented without particularly forming a multilayer ferri-structure.

In addition, it is desirable for the metal layer that allows for a spin-orbit interaction with the ferromagnetic dielectric layer to be made of either Pt, Au, Pd, Ag, Bi or an element having an f orbital. These elements have a large spin-orbit interaction, and therefore can efficiently generate a spin-orbit interaction and magnetic scattering from the interface in the interface between the metal layer and the ferromagnetic dielectric layer.

In addition, the present invention provides a magnetic memory having a memory cell made of a memory cell selecting transistor and a magnetic memory element, wherein the magnetic memory element in the above-described memory cell is a magnetoresistive effect element using a magnetoresistive effect generated in a current that flows through a metal layer that allows for a spin-orbit interaction with the above-described ferromagnetic dielectric layer along an interface, on at least the interface side, with a ferromagnetic dielectric layer and the above-described metal layer being joined through the above-described interface.

Thus, a magnetoresistive effect element where a ferromagnetic dielectric layer and a metal layer that allows for a spin-orbit interaction with the ferromagnetic dielectric layer are formed so as to have an interface through which the layers are joined is used as a magnetic memory element so that the reading out and writing in of information are possible without a current flowing through the ferromagnetic dielectric layer.

In addition, the threshold current at the time of writing in is proportional to the spin relaxation constant of the ferromagnetic body, and a ferromagnetic dielectric body having a small spin relaxation constant is used as the ferromagnetic body, and therefore the threshold current can be significantly reduced. In addition, the current flows through part of the metal layer having a low resistance, and therefore the voltage noise in the element can also be reduced.

In particular, YIG (yttrium iron garnet) or yttrium gallium iron garnet [$Y_3Fe_{5-x}Ga_xO_{12}$ ($0 \leq x < 5$)] having a small spin relaxation constant is used as the ferromagnetic dielectric layer, and as a result the efficiency in reversing the direction of magnetization through spin injection can be increased. Here, the threshold current is approximately several μA to several tens of μA.

Effects of the Invention

According to the present invention, a spin-orbit interaction and magnetic scattering from the interface that are generated in a current that flows through a metal layer having a spin-orbit interaction with a ferromagnetic dielectric layer, at least on the interface side, with the ferromagnetic dielectric layer and the metal layer being joined together through the interface are used, and therefore a magnetoresistive effect can be generated without a current flowing through the ferromagnetic dielectric layer, and as a result it is possible to greatly reduce the deterioration of the element caused by the current.

BEST MODE FOR CARRYING OUT THE INVENTION

Figure 1:
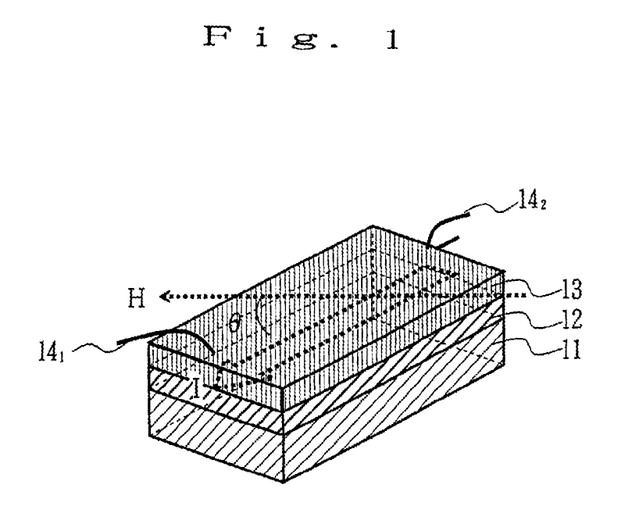
FIG. 1 is a schematic diagram showing the structure of the magnetic sensor according to an embodiment of the present invention.

The preferred embodiments of the present invention are described below in reference to FIGS. 1 to 5(b). FIG. 1 is a schematic diagram showing the structure of the magnetic sensor according to an embodiment of the present invention. A ferromagnetic dielectric layer 12 made of $Y_3Fe_{5-x}Ga_xO_{12}$ ($0 \leq x < 5$) is provided on a single crystal substrate 11, such as of GGG ($Gd_3Ga_5O_{12}$); a metal layer 13 having a spin-orbit interaction, typically a metal layer 13 made of an element having a large spin-orbit interaction, such as Pt, Au, Pd, Ag, Bi or an element having an f orbital, is provided on top of the ferromagnetic dielectric layer 12; and output terminals $14_1$ and $14_2$ are provided to the two ends of this metal layer 13. Here, θ is the angle between the external magnetic field H and the current I. In this case, the metal layer 13 is made of a single element having a large spin-orbit interaction, such as Pt, Au, Pd, Ag, Bi or an element having an f orbital or an alloy of these, or any of these single elements or alloys to which an impurity is doped.

Here, it is desirable for the ferromagnetic dielectric layer 12 to be thin as long as a spin-orbit interaction and magnetic scattering from the interface occur in the interface, and the film thickness needs to be approximately 5 nm in order for the ferromagnetic dielectric layer 12 to exhibit properties of a ferromagnetic body.

In addition, it is desirable for the metal layer to be thin in order for the contribution of the magnetoresistive effect due to the spin-orbit interaction and the magnetic scattering from the interface to be great in the interface in the current flowing through the metal layer. However, if the metal layer is too thin, the resistance is high, and therefore it is desirable for the thickness to be approximately 5 nm to 20 nm.

Figure 2:
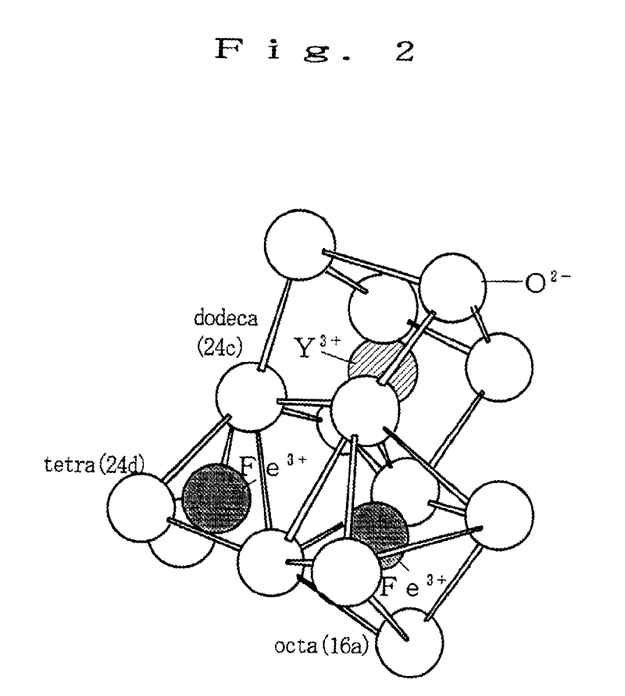
FIG. 2 is a diagram showing the structure of the crystal of YIG ($Y_3Fe_5O_{12}$)
Figure 3:
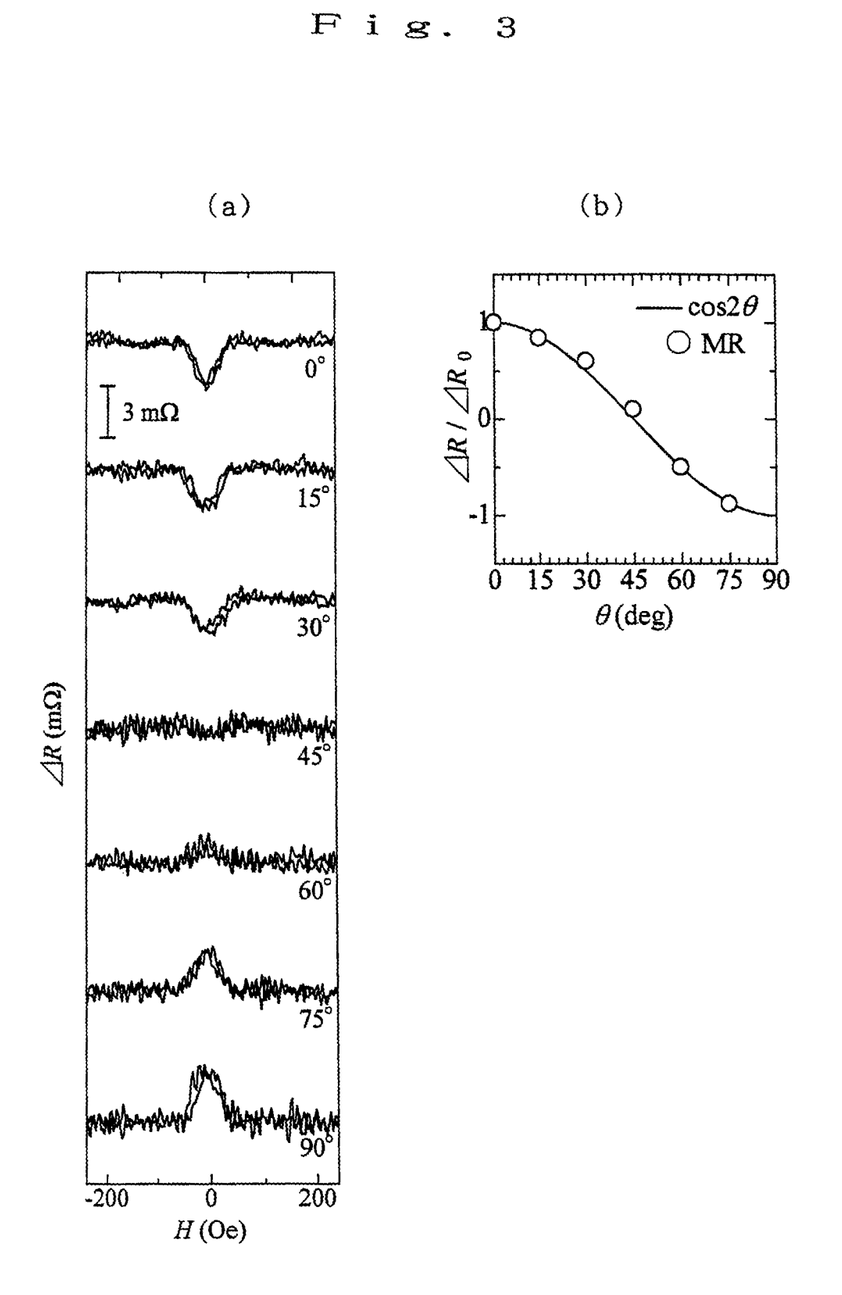
FIGS. 3(a) and 3(b) are graphs illustrating the dependency of the magnetoresistance ΔR of the magnetic sensor according to an embodiment of the present invention on the angle in the magnetic field.
Figure 4:
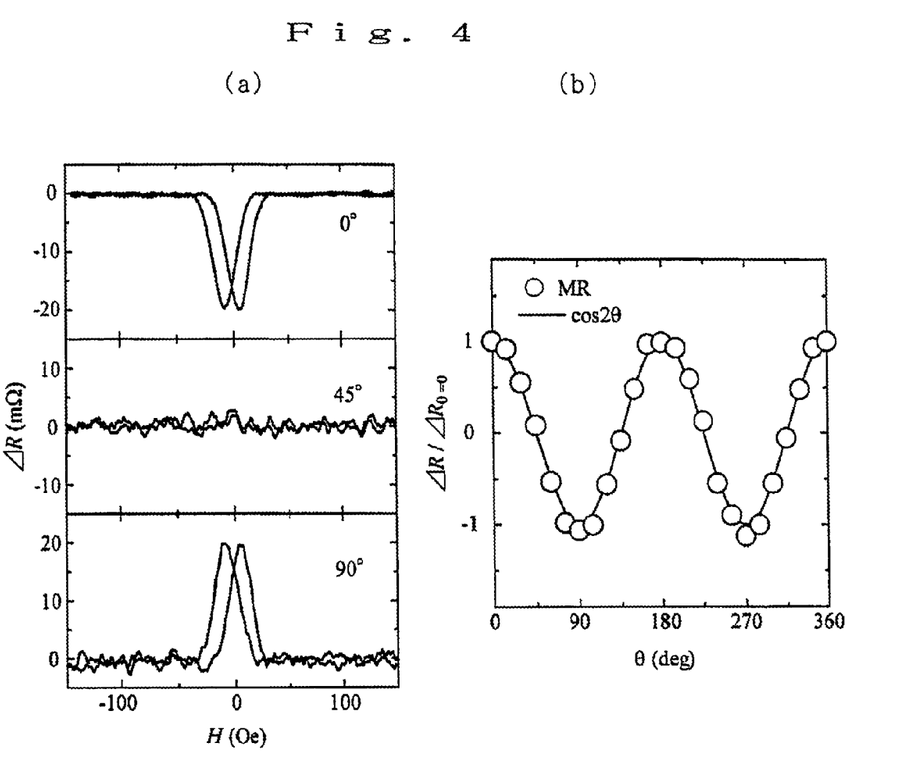
FIGS. 4(a) and 4(b) are graphs illustrating chronological change in the dependency of the magnetoresistance ΔR of the magnetic sensor according to an embodiment of the present invention on the angle in the magnetic field.
Figure 5:
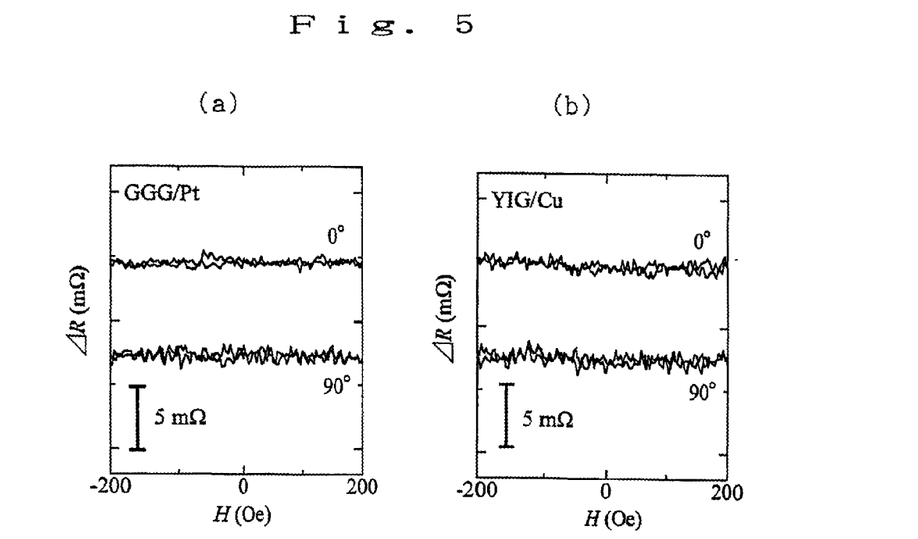
FIGS. 5(a) and 5(b) are graphs illustrating the dependency of the magnetoresistive effect on the substance.

FIG. 2 is a diagram showing the structure of the crystal of YIG ($Y_3Fe_5O_{12}$), and the crystal has a cubic crystal structure and a ferrimagnetic structure, and therefore the magnetic properties are thermally stable. In addition, $Fe^{3+}$ is the only magnetic ion in YIG, and there are 24 Fe ↑ (up spins) and 16 Fe ↓ (down spins) per lattice unit. Accordingly, YIG has a magnetic moment of 8 Fe per lattice unit. Here, the other Fe ions are connected in an antiferromagnetic manner.

Here, in the case of $Y_3Fe_{5-x}Ga_xO_{12}$, some Fe atoms in $Y_3Fe_5O_{12}$ are substituted with Ga atoms at random in the structure, and the number of Fe atoms having a magnetic moment is smaller in accordance with the Ga composition ratio x.

Any of a sputtering method, an MOD method (metal-organic decomposition method) and a sol-gel method may be used as the method for forming a film of the ferromagnetic dielectric layer 12. In addition, the crystallinity of the magnetic dielectric layer may be of single crystals or polycrystals.

In the case where an MOD method is used, for example, an MOD solution made by Kojundo Chemical Laboratory Co., Ltd. is heated on a hot plate at 150° C. for five minutes so that an excessive organic solvent is evaporated from the MOD solution, and after that the MOD solution is converted to an oxide layer through light baking where the MOD solution is heated for five minutes at 550° C. in an electrical furnace. Next, the crystallization of the oxide layer progresses through baking where the oxide layer is heated for one to two hours at 750° C. in the electrical furnace so that a YIG layer can be gained.

In the case where a current flows through the metal layer 13, the synergetic effects of the spin-orbit interaction and the magnetic scattering from the interface generates a magnetoresistive effect on the basis of the magnetization information in the ferromagnetic dielectric layer 12 on the metal layer 13 side in the interface through which the ferromagnetic dielectric layer 12 and the metal layer 13 are joined. As for the magnetoresistive effect, the external magnetic field applied to the ferromagnetic dielectric layer 12 is measured by reading the voltage across the output terminals $14_1$ and $14_2$.

At this time, in the case where the spin states of the electrons match the direction of magnetization of the ferromagnetic dielectric layer 12, the ferromagnetic dielectric layer 12 becomes of a high resistance state as a result of scattering. Meanwhile, in the case where the spin state of the electrons and the direction of magnetization of the ferromagnetic dielectric layer 12 are perpendicular, the ferromagnetic dielectric layer 12 becomes of a low resistance state as a result of light scattering.

FIGS. 3(a) and 3(b) are graphs illustrating the dependency of the magnetic resistance $\Delta R$ of the magnetic sensor according to an embodiment of the present invention on the angle of the magnetic field. Here, a current flows through the metal layer 13 in such a state that the voltage V across the output terminals $14_1$ and $14_2$ becomes constant when the resistance value is measured. In this case, the size of the element is 1 mm×5 mm, and YIG having a thickness of 5 nm is used as the ferromagnetic dielectric layer 12 and Pt having a thickness of 5 nm is used as the metal layer 13 for the measurement.

FIG. 3(a) shows a change in the resistance $\Delta R$ in the case where the external magnetic field H is changed from 200 [Oe] to −200 [Oe] and in the case where the external magnetic field H is changed from −200 [Oe] to 200 [Oe], where the results exhibit a slight difference reflecting the hysteresis properties. In addition, the angle θ between the external magnetic field H and the direction of the current is changed to 0°, 15°, 30°, 45°, 60°, 75° and 90° for the measurement.

FIG. 3(b) summarizes the dependence of the change in the resistance $\Delta R/\Delta R_0$ on the angle of the magnetic field where the results of FIG. 3(a) are standardized using the value of $\Delta R_0$ for θ=0°, which is shown to follow the curve cos 2θ as theoretically expected.

FIGS. 4(a) and 4(b) are graphs illustrating a chronological change in the dependency of the magnetoresistance $\Delta R$ of the magnetic sensor according to the embodiment of the present invention on the angle of the magnetic field, and the dependency of the magnetoresistance $\Delta R$ on the angle of the magnetic field is measured after the prepared material has been left in a vacuum container for several months. FIG. 4(a) shows a change in the resistance $\Delta R$ in the case where the external magnetic field H is changed from 150 [Oe] to −150 [Oe] and in the case where the external magnetic field H is changed from −150 [Oe] to 150 [Oe], where the results exhibit a slight difference reflecting the hysteresis properties. As is clear from the comparison with FIG. 3(a), it is confirmed that the change in the resistance is great. FIG. 4(b) summarizes the dependency of a change in the resistance $\Delta R/\Delta R_0$ on the angle of the magnetic field where the results of FIG. 3(a) are standardized using the value $\Delta R_0$ for θ=0°, which is shown to follow the curve of cos 2θ as theoretically expected when θ is in a range from 0° to 360°.

Next, the dependency of the magnetoresistive effect on the substance is described in reference to FIGS. 5(a) and 5(b). FIG. 5(a) is a graph illustrating the magnetoresistive effect in the interface through which a GGG crystal and Pt are joined, and no change in the resistance is seen because GGG does not have ferromagnetic properties.

FIG. 5(b) is a graph illustrating the magnetoresistive effect in the interface through which a YIG crystal and Cu are joined, and no change in the resistance is seen because Cu does not have an f orbital, and thus has a small spin-orbit interaction.

Judging from the above-described results and the principles used in the present invention, it is confirmed that it is essential for the metal layer to have an element having a large spin-orbit interaction as a main component in order to gain a magnetoresistive effect without a current flowing through the ferromagnetic layer, and it is also essential for the ferromagnetic layer to be a ferromagnetic dielectric layer.

It is possible to apply such a magnetoresistive effect to a magnetic head or a magnetic memory in the same manner as the conventional magnetoresistive effect, and in particular no current flows through the ferromagnetic layer, and therefore the element does not deteriorate due to a current.

EXAMPLE 1

Figure 6:
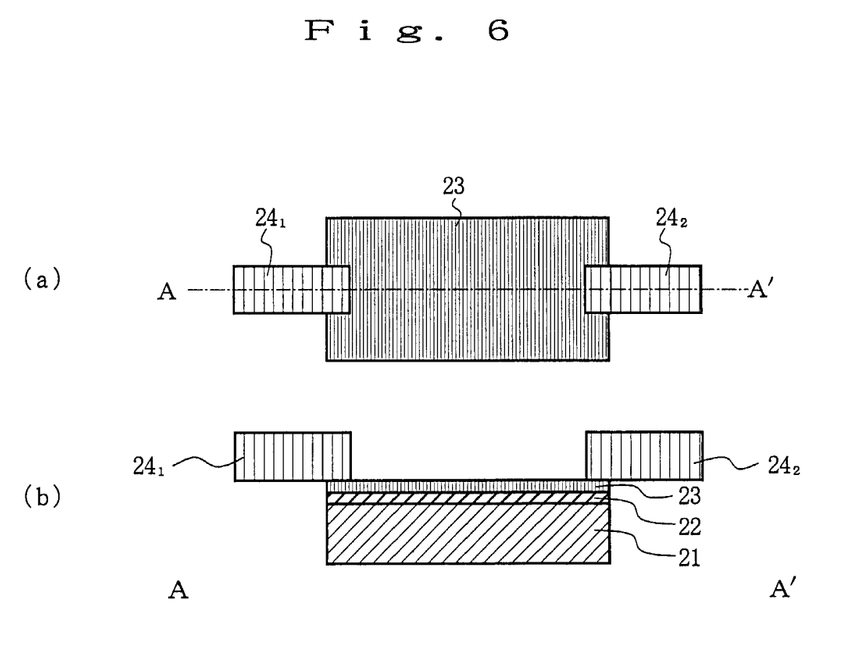
FIGS. 6(a) and 6(b) are schematic diagrams showing the structure of the magnetic sensor according to Example 1 of the present invention.

Next, the magnetic sensor according to Example 1 of the present invention is described in reference to FIGS. 6(a) and 6(b). FIGS. 6(a) and 6(b) are schematic diagrams showing the structure of the magnetic sensor according to Example 1 of the present invention, where FIG. 6(a) is a schematic plan diagram and FIG. 6(b) is a schematic cross-sectional diagram along single-dotted chain line A-A' in FIG. 6(a). A YIG layer 22 with a composition of $Y_3Fe_5O_{12}$ having a thickness of 5 nm, for example, is formed on a YIG single crystal substrate 21 in accordance with a sputtering method, and a Pt film having a thickness of 5 nm, for example, is deposited on top of the YIG layer 22 in accordance with a mask sputtering method so as to gain a Pt layer 23.

Next, the substrate is cut into pieces with a size of 1 mm×5 mm, and after that output terminals $24_1$ and $24_2$ are provided to the two ends of the Pt layer 23 in the longitudinal direction, and thus the basic structure of the magnetic sensor according to Example 1 of the present invention is completed. In this case, the YIG layer 22 may be a single crystal layer or a polycrystal layer.

This magnetic sensor is rotated step by step when a change in the magnetoresistance is measured so that the direction of the external magnetic field H can be sensitively detected. Alternatively, a number of magnetic sensors, which are the same as the above-described magnetic sensor, are arranged at predetermined angles so that the direction of the external magnetic field H can be sensitively detected through a single measurement.

EXAMPLE 2

Figure 7:
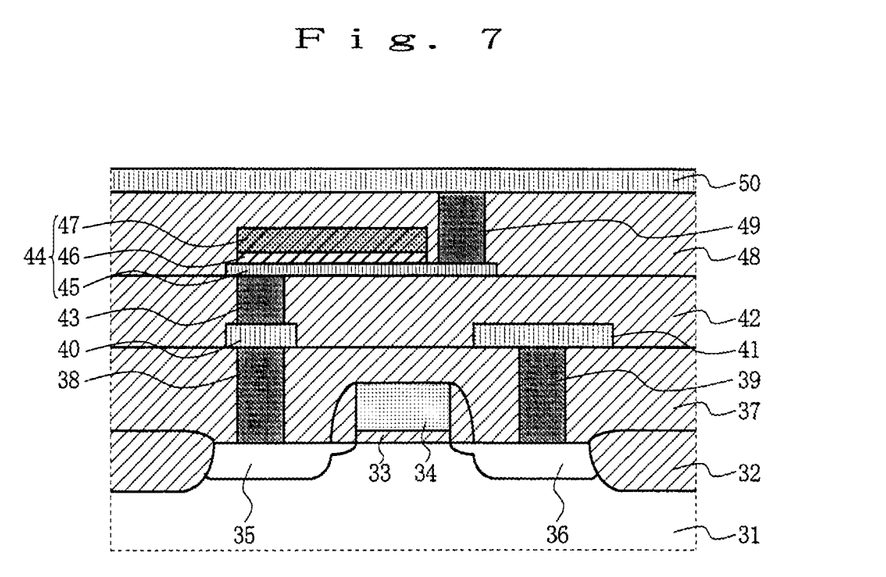
FIG. 7 is a schematic cross-sectional diagram showing a memory cell in the magnetic memory according to Example 2 of the present invention.

Next, the magnetic memory according to Example 2 of the present invention, which is an example application of the magnetic sensor, is described in reference to FIGS. 7 to 10(b). FIG. 7 is a schematic cross-sectional diagram showing a memory cell in the magnetic memory according to the present invention. As shown in FIG. 7, a p type silicon substrate 31 is selectively oxidized so that an element isolation film 32 is formed, and after that a gate electrode made of WSi that forms a word line 34 is formed in an element forming region surrounded by the element isolation film 32 with a gate insulating film 33 in between.

Next, ions, such as of P, are injected using the gate electrode as a mask so that an n+ type source region 35 and an n+ type drain region 36 are formed, and thus a memory cell selecting transistor 30 is formed. Here, the source region and the drain region may be switched. In addition, FIG. 7 schematically shows the structure, and therefore the description of the structure in detail, including sidewalls, extended regions and pocket regions that do not directly relate to the technical idea of the invention, is omitted.

Next, a first interlayer insulating film 37 made of a TEOS (tetra-ethyl-ortho-silicate)-NSG film, for example, is formed, and after that contact holes that reach to the n+ type source region 35 and n+ type drain region 36 are created. Then, these contact holes are lined with TaN and filled in with W so that W plugs 38 and 39 are formed.

Next, a TiN/Al/TiN layer, for example, is deposited on the entire surface, and after that patterned so that a connection conductor 40 and a source line 41 connected to the n+ type source region 35 are formed. In this case, the source line 41 actually runs in the direction perpendicular to the word line 34. Then, a second interlayer insulating film 42 that is also made of a TEOS-NSG film is formed, and after that a contact hole that reaches to the connection conductor 40 is created, and this contact hole is lined with TaN and filled in with W so that a W plug 43 is formed.

Next, a Pt film having a thickness of 5 nm, for example, is deposited on the entire surface, and after that is patterned so that a metal layer 45 is formed. Then, a YIG layer 46 and an antiferromagnetic layer 47 made of IrMn are formed in this order on the metal layer 45 in accordance with a mask sputtering method, for example, so that a magnetoresistive effect element 44 is formed. When this antiferromagnetic layer 47 made of IrMn is formed, a magnetic field is applied to the YIG layer 46 at an inclined angle relative to the direction of the longitudinal axis of the YIG layer 46 so that the direction of magnetization of the YIG layer 46 is inclined relative to the longitudinal direction. Here, the magnetic field has enough strength that the inversion of magnetization is possible through spin injection.

Next, a third interlayer insulating film 48 that is also made of a TEOS-NSG film is formed, and after that a contact hole that reaches to the metal layer 45 is created, and this contact hole is lined with TaN and filled in with W so that a W plug 49 is formed.

Then, a TiN/Al/TiN layer is deposited on the entire surface, and after that is patterned so that a bit line 50 is formed in the direction perpendicular to the word line 34, and thus the basic structure of the magnetic memory according to Example 2 of the present invention is completed. Here, the W plug 38 and the W plug 39 are at different locations, one being in the front and the other in the rear. The source line 41 and the bit line 50 run parallel to each other.

Figure 8:
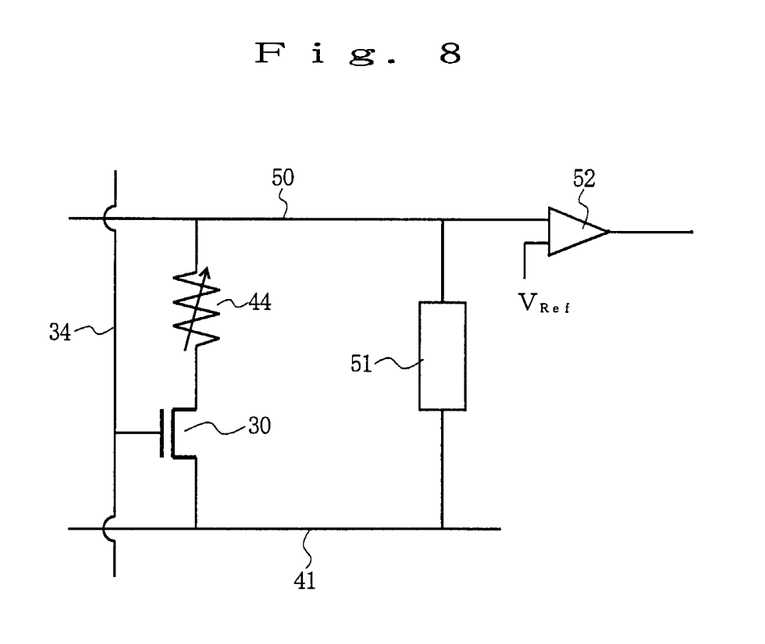
FIG. 8 is a diagram showing an equivalent circuit of a memory cell in the magnetic memory according to Example 2 of the present invention.
Figure 9:
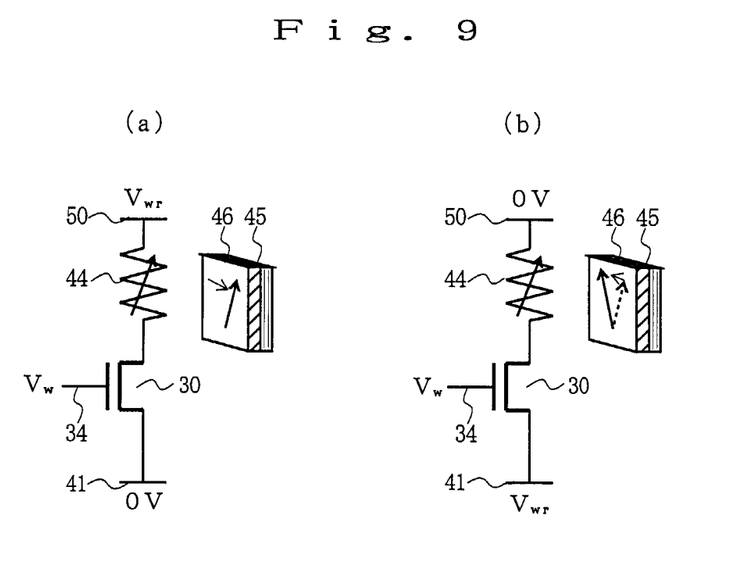
FIGS. 9(a) and 9(b) are diagrams illustrating the writing in method in the magnetic memory according to Example 2 of the present invention.
Figure 10:
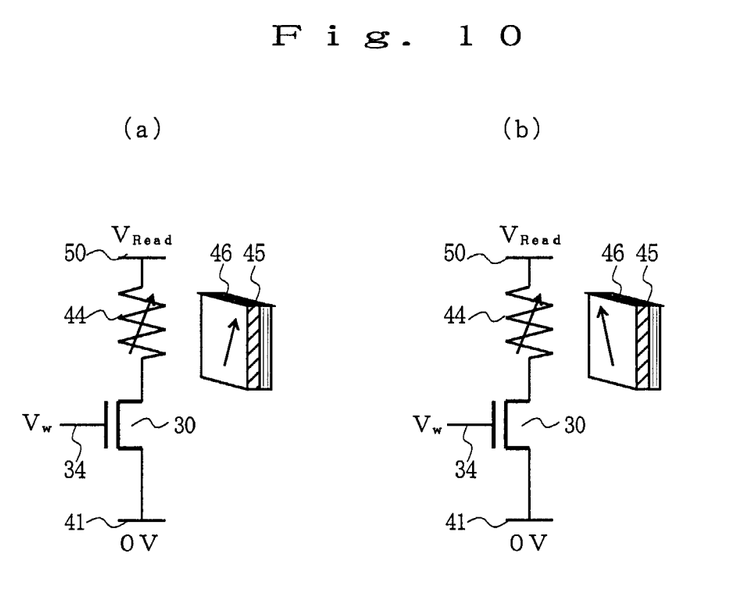
FIGS. 10(a) and 10(b) are diagrams illustrating the reading out method in the magnetic memory according to Example 2 of the present invention.

FIG. 8 is a diagram showing an equivalent circuit of a memory cell in the magnetic memory according to Example 2 of the present invention. As shown in FIG. 8, the magnetoresistive effect element 44 makes connection between the memory cell selecting transistor 30 and the bit line 50, and at the same time a bidirectional write in/read out voltage generator 51 makes connection between the bit line 50 and the source line 41 so that information corresponding to the direction of the current flowing through the bidirectional write in/read out voltage generator 51 is written into the magnetoresistive effect element 44 as magnetic information.

In addition, the bit line 50 is connected to a sense amplifier 52 into which a reference voltage $V_{Ref}$ is inputted through another terminal, and a current flowing through the magnetoresistive effect element 44 is detected by the sense amplifier 52 via the bit line 50 in such a state that the source line 41 is grounded, and thus magnetic information is read out.

FIGS. 9(a) and 9(b) are diagrams illustrating the write in method for the magnetic memory according to Example 2 of the present invention. FIG. 9(a) is a diagram illustrating the write in method for "0," where the bidirectional write in/read out voltage generator 51 sets the source line 41 to 0 V and the bit line 50 to $V_{wr}$ so that a current flows through the metal layer 45 that forms the magnetoresistive effect element 44. As a result, a pure spin flow generated by the spin Hall effect is injected into the YIG layer 46 so that the direction of the spins makes the direction of magnetization of the YIG layer 46 be the same as the direction of magnetization regulated by the antiferromagnetic layer, and thus "0" is written in.

FIG. 9(b) is a diagram illustrating the write in method for "1," where the bidirectional write in/read out voltage generator 51 sets the source line 41 to $V_{wr}$ and the bit line 50 to 0 V so that a current flows through the metal layer 45 that forms the magnetoresistive effect element 44 in the direction opposite to that in the case of writing in of "0," and thus a pure spin flow generated by the spin Hall effect is injected into the YIG layer 46.

At this time, the direction of the spins in the pure spin flow is opposite to the direction in the case of the writing in of "0," and therefore the direction of magnetization of the YIG layer 46 inclines in the opposite direction in reference to the direction of the longitudinal axis, and thus "1" is written in. Here, writing in is possible with a current as small as 10 μA or less because YIG, which has a small spin relaxation constant, is used as the ferromagnetic body.

FIGS. 10(a) and 10(b) are diagrams illustrating the read out method for the magnetic memory according to Example 2 of the present invention. In this case, it is necessary for the read out voltage $V_{read}$ to be set sufficiently lower than the write in voltage $V_{wr}$ in order to prevent an error in the writing in.

FIG. 10(a) is a diagram illustrating the read out method for "0," where the bidirectional write in/read out voltage generator 51 sets the source line 41 to 0 V and the bit line 50 to $V_{read}$ so that a current flows through the metal layer 45 that forms the magnetoresistive effect element 44. As a result, the spins in the pure spin flow generated by the spin Hall effect are in such a direction that makes scattering difficult in the direction of magnetization of the YIG layer 46. Accordingly, not many electrons are scattered from the interface between YIG and the metal layer, which provides a low resistance state, and this is detected by the sense amplifier 52 so that "0" is read out.

FIG. 10(b) is a diagram illustrating the read out method for "1," where the bidirectional write in/read out voltage generator 51 sets the source line 41 to 0 V and the bit line 50 to $V_{read}$ so that a current flows through the metal layer 45 that forms the magnetoresistive effect element 44. As a result, the spins in the pure spin flow generated by the spin Hall effect are in such a direction that makes scattering easy in the direction of magnetization of the YIG layer 46. Accordingly, electrons are scattered from the interface between YIG and the metal layer, which provides a high resistance state, and this is detected by the sense amplifier 52 so that "1" is read out.

As described above, in Example 2 of the present invention, the interface through which the YIG layer 46 and the metal layer 45 are joined is used as the magnetoresistive effect element, and therefore the element structure is simple in comparison with the GMR element or the TMR element of which the element structure is essentially a multilayer structure, and thus the number of manufacturing steps can be reduced.

In addition, no current flows through the ferromagnetic layer in Example 2 of the present invention, and therefore the magnetoresistive effect element does not deteriorate due to a current, and thus it is possible to increase the durability.

Furthermore, a current flows through the metal layer 45 having a low resistance in Example 2 of the present invention, and therefore it is also possible to greatly reduce the element noise in comparison with the GMR element or the TMR element where a current flows through the multilayer film in the direction in which it is layered.

EXAMPLE 3

Figure 11:
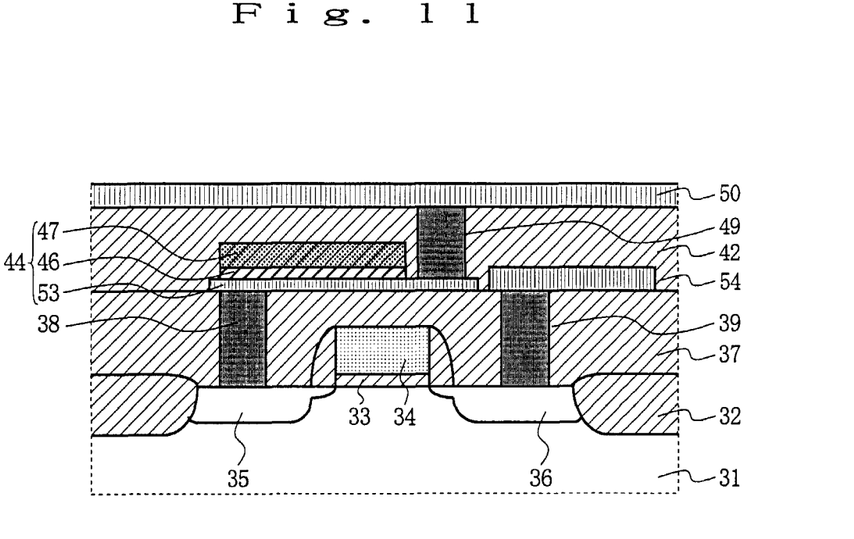
FIG. 11 is a schematic cross-sectional diagram showing a memory cell in the magnetic memory according to Example 3 of the present invention.

Next, the magnetic memory according to Example 3 of the present invention, which is an example of an application of the magnetic sensor, is described in reference to FIG. 11. FIG. 11 is a schematic cross-sectional diagram showing a memory cell of the magnetic memory according to the present invention. As shown in FIG. 11, a p type silicon substrate 31 is selectively oxidized so that an element isolation film 32 is formed, and after that a gate electrode made of WSi that forms a word line 34 is formed in an element forming region surrounded by the element isolation film 32 with a gate insulating film 33 in between.

Next, ions, such as of P, are injected using the gate electrode as a mask so that an n+ type source region 35 and an n+ type drain region 36 are formed, and thus a memory cell selecting transistor 30 is formed. Here as well, the description of the structure in detail, including sidewalls, extended regions and pocket regions that do not directly relate to the technical idea of the invention, is omitted.

Next, a first interlayer insulating film 37 made of a TEOS-NSG film, for example, is formed, and after that contact holes that reach to the n+ type source region 35 and n+ type drain region 36 are created. Then, these contact holes are lined with TaN and filled in with W so that W plugs 38 and 39 are formed. Here, the W plug 38 and the W plug 39 are at different locations, one being in the front and the other in the rear.

Next, a Pt film, for example, is deposited on the entire surface, and after that is patterned so that a metal layer 53 that is connected to the W plug 38 and a source line 54 that is connected to the W plug 39 are formed. At this time, the metal layer 53 and the source line 54 are formed so as to be perpendicular to the word line 34 and are parallel to each other, but FIG. 11 only shows part of the source line 54 for convenience.

Next, only the metal layer 53 is selectively thinned to a thickness of 5 nm, for example, and after that a YIG layer 46 and an antiferromagnetic layer 47 made of IrMn are formed in this order on top of the metal layer 53 in accordance with a mask sputtering method so that a magnetoresistive effect element 44 is formed. When this antiferromagnetic layer 47 made of IrMn is formed, a magnetic field is applied to the YIG layer 46 in the direction that inclines relative to the direction of the longitudinal axis of the YIG layer 46 so that the direction of magnetization of the YIG layer 46 is inclined relative to the longitudinal direction.

Next, a second interlayer insulating film 42 also made of a TEOS-NSG film is formed, and after that a contact hole that reaches to the metal layer 53 is created, and this contact hole is line with TaN and is filled in with W so that a W plug 49 is formed.

Then, a TiN/Al/TiN layer is deposited on the entire surface, and after that patterned so that a bit line 50 is formed so as to run in the direction perpendicular to the word line 34, and thus the basic structure of the magnetic memory according to Example 3 of the present invention is completed.

Though the principle in which the magnetic memory according to Example 3 of the present invention operates is the same as that for the above-described magnetic memory according to Example 2, the metal layer that forms the magnetoresistive effect element and the source line are formed of Pt in the same layer level in Example 3 of the present invention, and therefore the multilayer structure has one less layer.

EXAMPLE 4

Figure 12:
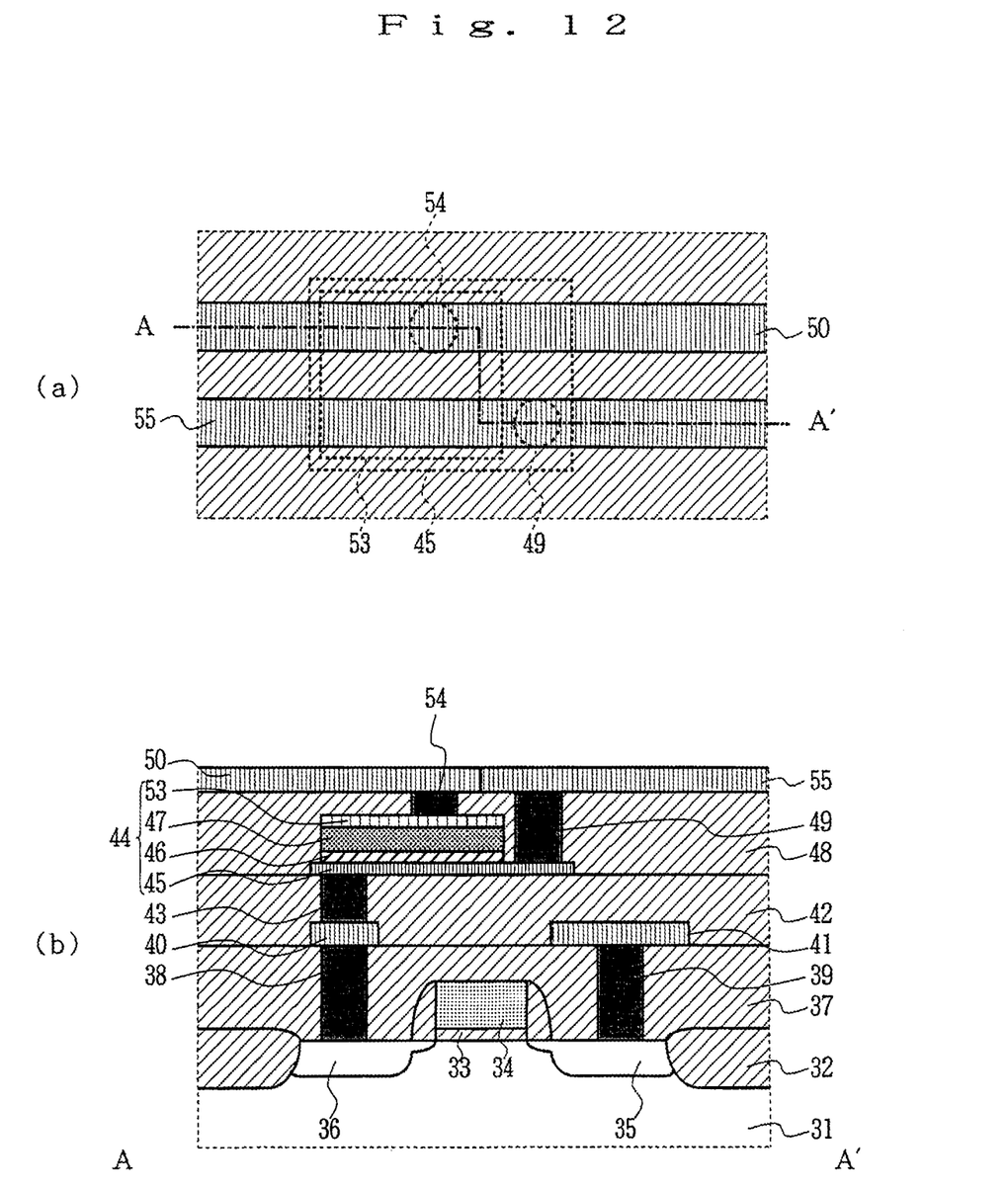
FIGS. 12(a) and 12(b) are schematic diagrams showing the structure of a memory cell in the magnetic memory according to Example 4 of the present invention.

Next, the magnetic memory according to Example 4 of the present invention, which is an example of the application of the magnetic sensor, is described in reference to FIGS. 12(*a*) to 15(*b*). FIGS. 12(*a*) and 12(*b*) are schematic diagrams showing the structure of a memory cell of the magnetic memory according to the present invention, where FIG. 12(*a*) is a plan diagram and FIG. 12(*b*) is a cross-sectional diagram along line A-A' in FIG. 12(*a*). As shown in FIGS. 12(*a*) and 12(*b*), the basic structure is exactly the same as in Example 2 of the present invention shown in FIG. 7, but a write in line is separately provided so that the reading out line and the writing in line can be separated.

In exactly the same steps as in Example 2, a Pt film having a thickness of 5 nm, for example, is deposited, and after that patterned so that a metal layer 45 is formed. Next, a YIG layer 46, an antiferromagnetic layer 47 made of IrMn and a Ta cap layer 53 are formed in this order on top of the metal layer 45 in accordance with a mask sputtering method so that a magnetoresistive effect element 44 is formed. When this antiferromagnetic layer 47 made of IrMn is formed, a magnetic field is applied to the YIG layer 46 in the direction that is inclined relative to the direction of the longitudinal axis of the YIG layer 46 so that the direction of magnetization of the YIG layer 46 is inclined relative to the longitudinal direction. Here, the magnetic field is strong enough so that inversion of magnetization is possible through spin injection.

Next, a third interlayer insulating film 48 also made of a TEOS-NSG film is formed, and after that a contact hole that reaches to the metal layer 45 and a contact hole that reaches to the Ta cap layer 53 are created, and these contact holes are lined with TaN and are filled in with W so that W plugs 49 and 54 are formed.

Then, a TiN/Al/TiN layer is deposited on the entire surface, and after that patterned as shown in FIG. 12(*b*) so that a bit line 50 that is connected to the W plug 53 and a write in line 55 that is connected to the W plug 49 are formed in the direction perpendicular to the word line 34, and thus the basic structure of the magnetic memory according to Example 4 of the present invention is completed.

Figure 13:
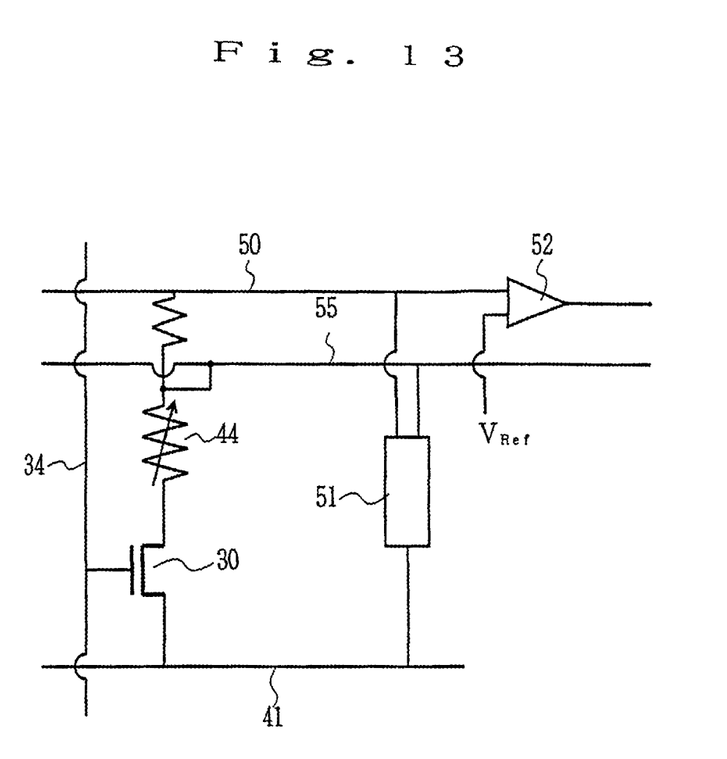
FIG. 13 is a diagram showing an equivalent circuit of a memory cell in the magnetic memory according to Example 4 of the present invention.

FIG. 13 is a diagram showing an equivalent circuit of a memory cell of the magnetic memory according to Example 4 of the present invention. As shown in FIG. 13, the magnetoresistive effect element 44 makes connection between the memory cell selecting transistor 30, the bit line 50 and the write in line 55. In addition, a bidirectional write in/read out voltage generator 51 makes connection between the bit line 50, the write in line 55 and the source line 41 so that the information corresponding to the direction of the current flowing through the bidirectional write in/read out voltage generator 51 is written into the magnetoresistive effect element 44 as magnetic information.

In addition, the bit line 50 is connected to a sense amplifier 52 into which a reference voltage $V_{Ref}$ is inputted through another terminal so that the current that flows through the magnetoresistive effect element 44 in the direction in which it is layered is detected by the sense amplifier 52 via the bit line 50 in such a state that the source line 41 is grounded, and thus the magnetic information is read out.

Figure 14:
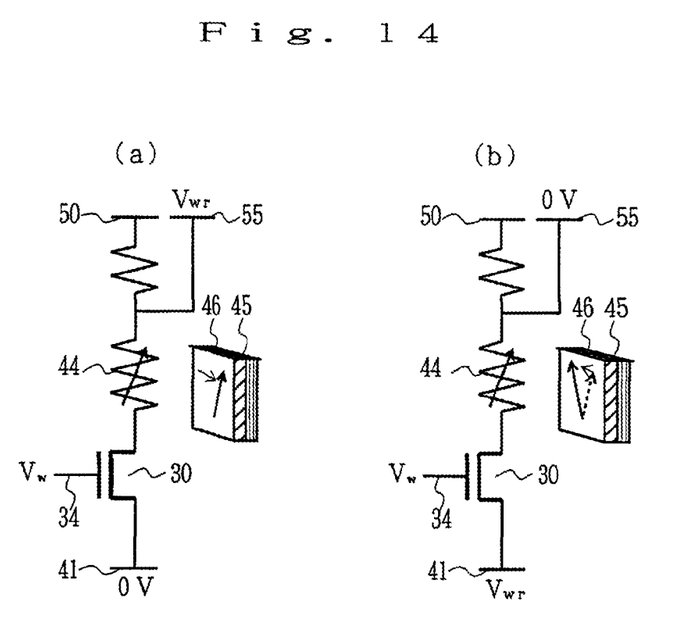
FIGS. 14(a) and 14(b) are diagrams illustrating the writing in method in the magnetic memory according to Example 4 of the present invention.

FIGS. 14(a) and 14(b) are diagrams illustrating the write in method for the magnetic memory according to Example 4 of the present invention. FIG. 14(a) is a diagram illustrating the write in method for "0," where the bidirectional write in/read out voltage generator 51 sets the source line 41 to 0 V and the write in line 55 to $V_{wr}$ so that a current flows through the metal layer 45 that forms the magnetoresistive effect element 44. As a result, the pure spin flow generated by the spin Hall effect is injected into the YIG layer 46, and the direction of the spins makes the direction of magnetization of the YIG layer 46 to be the same as the direction of magnetization regulated by the antiferromagnetic layer, and thus "0" is written in.

FIG. 14(b) is a diagram illustrating the write in method for "1," where the bidirectional write in/read out voltage generator 51 sets the source line 41 to $V_{wr}$ and the write in line 55 to 0 V so that a current flows through the metal layer 45 that forms the magnetoresistive effect element 44 in the direction opposite to that in the case of the writing in of "0", and as a result, the pure spin flow generated by the spin Hall effect is injected into the YIG layer 46.

At this time, the direction of the spins in the pure spin flow is opposite to that in the case of writing in of "0," and therefore the direction of magnetization of the YIG layer 46 is inclined in the opposite direction in reference to the direction of the longitudinal axis, and thus "1" is written in. Here, YIG having a small spin relaxation constant is used as the ferromagnetic body and therefore this current that makes writing in possible can be as small as 10 μA or less.

Figure 15:
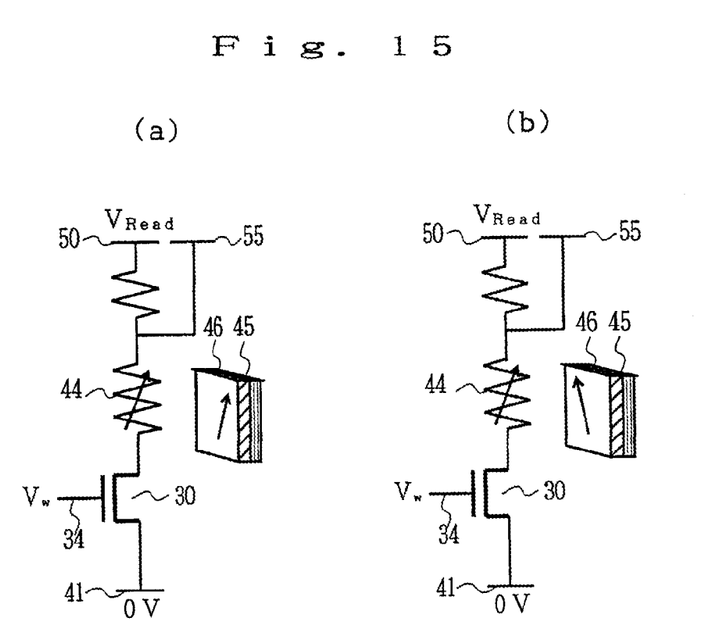
FIGS. 15(a) and 15(b) are diagrams illustrating the reading out method in the magnetic memory according to Example 4 of the present invention.

FIGS. 15(a) and 15(b) are diagrams illustrating the read out method for the magnetic memory according to Example 4 of the present invention, where FIG. 15(a) is a diagram illustrating the reading out method for "0" and FIG. 15(b) is a diagram illustrating the read out method for "1." In both cases, the bidirectional write in/read out voltage generator 51 sets the source line 41 to 0 V and the bit line 50 to $V_{read}$ so that a current flows through the magnetoresistive effect element 44 in the direction in which it is layered. In this case, the resistance is different depending on the direction of magnetization of the YIG layer 46 in the same manner as in the conventional MRAM, and therefore "0" or "1" can be read out. Here, the thickness of the YIG layer 46 provides additional resistance.

Thus, in Example 4 of the present invention as well, the interface through which the YIG layer 46 and the metal layer 45 are joined is used as the magnetoresistive effect element, and therefore the element structure is simple in comparison with the GMR element or the TMR element of which the element structure is essentially a multilayer structure, and thus the number of manufacturing steps can be reduced.

In addition, in Example 4 of the present invention, the same method as in the conventional MRAM is adopted for reading out, and thus information can be read out with sufficient sensitivity.

Though the embodiments and examples of the present invention are described in the above, the present invention is not limited to have the structures and conditions of the embodiments and examples and various modifications are possible. For example, though Pt is used for the metal layer in the above-described examples, the material is not limited to Pt, and Pd that has a large spin-orbit interaction in the same manner as Pt, Au, Ag, Bi, other elements having an f orbital or a transition metal having a 3 d orbital may be used. Furthermore, the material need not be a single metal and may be an alloy of these metals. In addition, any of these single metals, alloys or alloys made of any of these single metals or alloys and Cu, Al, Si or the like may be used, and moreover materials gained by adding impurities to these metals or alloys may be used.

Though in Example 2 or Example 3 an antiferromagnetic layer made of IrMn is provided in order to apply a bias to the YIG layer in the direction of magnetization, a metal ferromagnetic body, such as of CoFeB may be used.

Though in the above examples $Y_3Fe_{5-x}Ga_xO_{12}$ (0≤X<5) is used as the ferromagnetic dielectric body, the material is not limited to a pure $Y_3Fe_{5-x}Ga_xO_{12}$, and may be doped with impurities, such as Bi or Si. Furthermore, a ferromagnetic dielectric body other than $Y_3Fe_{5-x}Ga_xO_{12}$, such as of garnet ferrite, may be used. Moreover, spinel ferrite $MO/Fe_2O_3$ (M is Co, Ni or the like), for example, $CoO/Fe_2O_3$, or hexagonal crystal ferrite $MFe_{12}O_{19}$ (M is Ba, Sr or the like), for example, $BaFe_{12}O_{19}$, may be used.

The invention claimed is:

1. A magnetic sensor comprising:
 a ferromagnetic dielectric layer; and
 a metal layer joined with the ferromagnetic dielectric layer through an interface, the metal layer being formed of a metal which allows a spin-orbit interaction with the ferromagnetic dielectric layer,
 wherein said magnetic sensor uses a magnetoresistive effect is generated in a current that flows through said metal layer along said interface, on at least the interface side, the magnetoresistive effect being generated by synergetic effects of the spin-orbit interaction and magnetic scattering at the interface without a current flow through the ferromagnetic dielectric layer.

2. The magnetic sensor according to claim 1, wherein said ferromagnetic dielectric layer is made of $Y_3Fe_{5-x}Ga_xO_{12}$ (0≤x <5).

3. The magnetic sensor according to claim 1, wherein said metal layer is made of Pt, Au, Pd, Ag, Bi or an element having an f orbital.

4. The magnetic sensor according to claim 2, wherein said metal layer is made of Pt, Au, Pd, Ag, Bi or an element having an f orbital.

5. A magnetic memory comprising a memory cell comprising:
 a magnetic memory element comprising
  a ferromagnetic dielectric layer, and
  a metal layer joined with the ferromagnetic dielectric layer through an interface, the metal layer being formed of a metal which allows a spin-orbit interaction with the ferromagnetic dielectric layer; and
 a memory cell selecting transistor connected to the magnetic memory element,
 wherein the magnetic memory element in said memory cell uses a magnetoresistive effect generated in a current that flows through a metal layer along an interface, on at least the interface side, the magnetoresistive effect being generated by synergetic effects of the spin-orbit interaction and magnetic scattering at the interface without a current flow through the ferromagnetic dielectric layer.

6. The magnetic memory according to claim 5, wherein said ferromagnetic dielectric layer is made of $Y_3Fe_{5-x}Ga_xO_{12}$ (0≤x <5).

7. The magnetic memory according to claim 5, wherein said metal layer is made of Pt, Au, Pd, Ag, Bi or an element having an f orbital.

8. The magnetic memory according to claim 6, wherein said metal layer is made of Pt, Au, Pd, Ag, Bi or an element having an f orbital.

* * * * *